US011550681B2

(12) United States Patent
Gaur et al.

(10) Patent No.: US 11,550,681 B2
(45) Date of Patent: Jan. 10, 2023

(54) SYSTEM AND METHOD FOR ERROR INJECTION IN SYSTEM-ON-CHIP

(71) Applicant: NXP USA, Inc., Austin, TX (US)

(72) Inventors: Abhinav Gaur, Agra (IN); Neha Bagri, Noida (IN)

(73) Assignee: NXP USA, Inc., Austin, TX (US)

(*) Notice: Subject to any disclaimer, the term of this patent is extended or adjusted under 35 U.S.C. 154(b) by 87 days.

(21) Appl. No.: 17/087,537

(22) Filed: Nov. 2, 2020

(65) Prior Publication Data

US 2022/0138066 A1    May 5, 2022

(51) Int. Cl.
G06F 11/22      (2006.01)
G06F 11/263     (2006.01)
G06F 11/30      (2006.01)
G11C 29/12      (2006.01)
G06F 11/07      (2006.01)

(52) U.S. Cl.
CPC ...... *G06F 11/2215* (2013.01); *G06F 11/0772* (2013.01); *G06F 11/0784* (2013.01); *G06F 11/263* (2013.01); *G06F 11/3013* (2013.01); *G06F 11/3037* (2013.01); *G11C 29/12015* (2013.01)

(58) Field of Classification Search
CPC ............. G06F 11/2215; G06F 11/0772; G06F 11/0784; G06F 11/263; G06F 11/3013; G06F 11/3037; G11C 29/12015
USPC ....................................................... 714/703
See application file for complete search history.

(56) References Cited

U.S. PATENT DOCUMENTS

| | | |
|---|---|---|
| 6,182,248 B1 * | 1/2001 | Armstrong ............ G06F 11/221 714/757 |
| 7,293,153 B2 | 11/2007 | Vu et al. |
| 8,181,100 B1 | 5/2012 | Purdham et al. |
| 8,271,932 B2 | 9/2012 | Bair et al. |
| 10,319,461 B2 | 6/2019 | Kwon et al. |
| 2012/0266033 A1 * | 10/2012 | Gold ..................... G11C 29/02 714/E11.02 |
| 2016/0292059 A1 | 10/2016 | Catherwood et al. |
| 2017/0249225 A1 * | 8/2017 | Guddeti ............... G06F 11/263 |
| 2019/0013085 A1 * | 1/2019 | Benedict .............. G11C 29/42 |
| 2019/0050308 A1 | 2/2019 | Chaudhari et al. |
| 2022/0091928 A1 * | 3/2022 | Fernandes ........... G06F 11/0772 |

* cited by examiner

*Primary Examiner* — James C Kerveros

(57) ABSTRACT

A system-on-chip includes a memory, an error injection controller, an injection logic circuit, and an error detection circuit. The error injection controller is configured to generate and transmit error data, and at least one of read and write access requests associated with the memory to the injection logic circuit. The injection logic circuit is configured to access the memory based on at least one of the read and write access requests to execute at least one of read and write operations. The injection logic circuit is further configured to inject an error in at least one of first data and second data to generate at least one of erroneous first data and erroneous second data, respectively. The error detection circuit is configured to detect an error in at least one of the erroneous first data and the erroneous second data to generate an error signal.

22 Claims, 9 Drawing Sheets

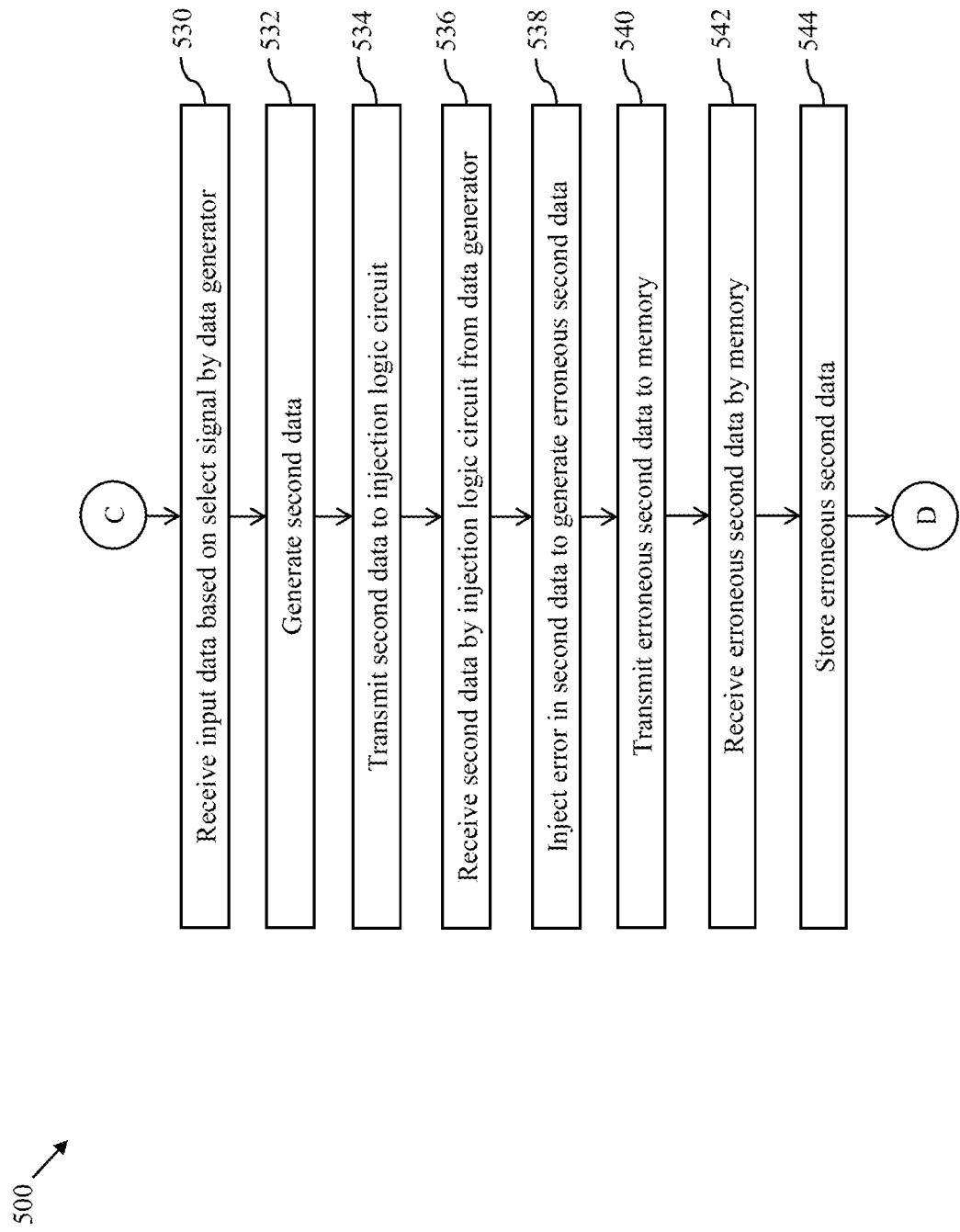

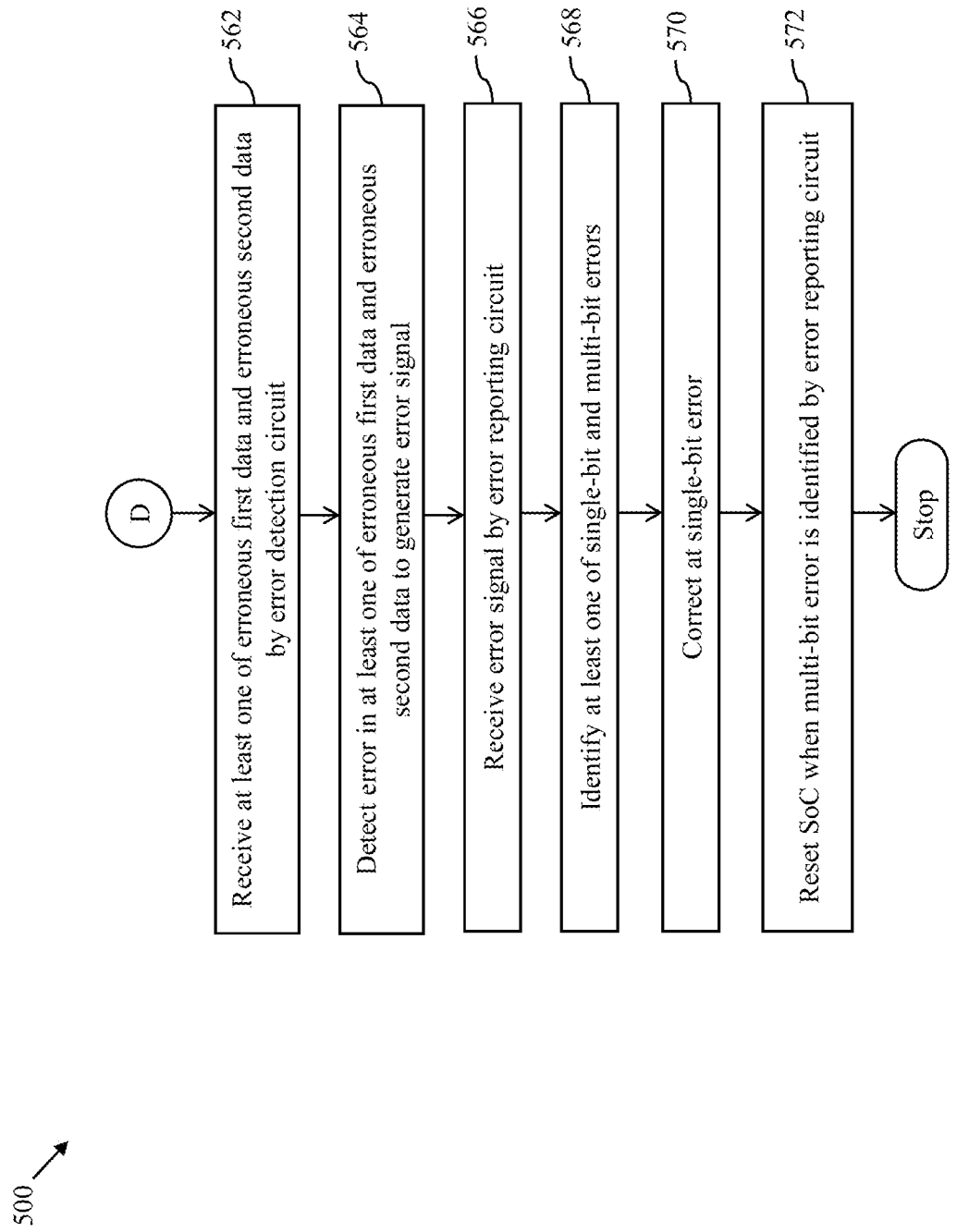

SYSTEM AND METHOD FOR ERROR INJECTION IN SYSTEM-ON-CHIP

BACKGROUND

The present disclosure relates generally to electronic circuits, and, more particularly, to a system and a method for injecting errors in a system-on-chip (SoC).

An SoC includes various intellectual property (IP) cores (e.g., math accelerators, image processors, digital signal processors, and the like) that initiate memory operations such as reading and writing of data associated with various memories of the SoC. To detect and correct errors associated with data written to or read from a memory of the SoC, the SoC further includes an error control circuit. In addition, the SoC includes an error injection system that tests the error control circuit by injecting errors in the error control circuit. A conventional error injection system typically executes a set of initialization instructions to generate a read or write access to the memory before performing the error injection. However, when the memory includes non-memory mapped segments, the IP cores of the SoC need to be configured by programming multiple registers of the IP core to generate the read or write access to the memory. Thus, due to the execution of the set of initialization instructions and the configuration of the IP cores, a speed of operation of the SoC is affected and a design complexity to access the memory for performing the error injection increases significantly. Therefore, there exists a need for a technical solution that solves the aforementioned problems of the conventional error injection systems.

SUMMARY

In one embodiment, a system-on-chip (SoC) is disclosed. The SoC includes a memory, an error injection controller, an injection logic circuit, and an error detection circuit. The error injection controller is coupled with the memory, and configured to generate error data, a trigger signal, and at least one of read and write access requests associated with the memory. The injection logic circuit is coupled with the error injection controller, and configured to receive the error data, the trigger signal, at least one of the read and write access requests, and at least one of first data and second data. The injection logic circuit is further configured to access the memory based on the trigger signal and at least one of the read and write access requests to execute at least one of read and write operations associated with the first data and the second data. The injection logic circuit is further configured to inject, based on the error data and the trigger signal after accessing the memory, an error in at least one of the first data and the second data to generate at least one of erroneous first data and erroneous second data, respectively. The error detection circuit is coupled with the injection logic circuit, and configured to receive at least one of the erroneous first data and the erroneous second data, and detect the error in at least one of the erroneous first data and the erroneous second data to generate an error signal.

In another embodiment, an error injection method is disclosed. The error injection method includes generating, by an error injection controller of an SoC, error data, a trigger signal, and at least one of read and write access requests associated with a memory of the SoC, and receiving, by an injection logic circuit of the SoC, the error data, the trigger signal, at least one of the read and write access requests, and at least one of first data and second data. The error injection method further includes accessing, by the injection logic circuit, the memory based on the trigger signal and at least one of the read and write access requests to execute at least one of read and write operations associated with the first data and the second data. The error injection method further includes injecting, by the injection logic circuit based on the error data and the trigger signal after accessing the memory, an error in at least one of the first data and the second data to generate at least one of erroneous first data and erroneous second data, respectively. The error injection method further includes receiving, by an error detection circuit of the SoC, at least one of the erroneous first data and the erroneous second data, and detecting, by the error detection circuit, the error in at least one of the erroneous first data and the erroneous second data to generate an error signal.

In some examples, the injection logic circuit comprises an edge detection circuit and a selection circuit. The edge detection circuit is coupled with the error injection controller, and configured to receive the trigger signal, detect an edge of the trigger signal, and generate a select signal based on the detected edge of the trigger signal. The selection circuit is coupled with the edge detection circuit and the error injection controller, and configured to receive the select signal, control information, and at least one of the read and write access requests. The selection circuit is further coupled with the memory, and further configured to select and transmit, based on the select signal, one of the control information and at least one of the read and write access requests to the memory.

In some examples, the SoC further includes a processing core that is coupled with the selection circuit, and configured to generate and transmit the control information to the selection circuit to execute a set of memory operations. The control information includes at least one of control data, a memory address of the memory, and a memory access request. The control data corresponds to at least one of data to be written to and data to be read from a memory location associated with the memory address based on the memory access request.

In some examples, the injection logic circuit further comprises a delay circuit and an error injector. The delay circuit is coupled with the edge detection circuit, and configured to receive the select signal and delay the select signal by a predetermined value to generate a delay signal. The error injector is coupled with the delay circuit, the error injection controller, and the memory, and configured to receive the delay signal and inject the error in at least one of the first data and the second data based on the error data and the delay signal to generate at least one of the erroneous first data and the erroneous second data, respectively.

In some examples, the selection circuit is further coupled with the memory, and further configured to receive and transmit the first data to the memory to execute the read operation when the selection circuit outputs the read access request. The memory is configured to receive and store the first data at a read address of the memory associated with the read access request. The error injection controller is further configured to generate the first data.

In some examples, the error injector is further configured to receive the first data from the memory. The error injector generates the erroneous first data such that the erroneous first data has at least one of single-bit and multi-bit errors.

In some examples, the error injector is further coupled with the error detection circuit, and further configured to transmit the erroneous first data to the error detection circuit.

In some examples, when the selection circuit outputs the write access request, the selection circuit is further configured to receive and output input data to execute the write operation. The error injection controller is further configured to generate the input data.

In some examples, the SoC further includes a data generator that is coupled with the selection circuit, and configured to receive the input data based on the select signal. The data generator is further coupled with the error injector, and further configured to generate and transmit the second data to the error injector.

In some examples, the error injector is further configured to receive the second data from the data generator. The error injector generates the erroneous second data such that the erroneous second data has at least one of single-bit and multi-bit errors. The error injector is further configured to transmit the erroneous second data to the memory. The memory is further configured to receive and store the erroneous second data at a write address of the memory associated with the write access request. The error detection circuit receives the erroneous second data from the memory.

In some examples, the SoC further includes an error reporting circuit that is coupled with the error detection circuit, and configured to receive the error signal and identify at least one of single-bit and multi-bit errors as the detected error. The error signal indicates at least one of single-bit and multi-bit errors. The error reporting circuit is further configured to correct the single-bit error, and reset the SoC when the error reporting circuit identifies the multi-bit error.

Various embodiments of the present disclosure disclose an SoC. The SoC includes a memory, an error injection controller, an injection logic circuit, and an error detection circuit. The error injection controller is configured to generate error data, a trigger signal, and at least one of read and write access requests associated with the memory. The injection logic circuit is configured to receive the error data, the trigger signal, at least one of the read and write access requests, and at least one of the first data and the second data. Based on the received trigger signal and at least one of the read and write access requests, the injection logic circuit is further configured to access the memory to execute at least one of read and write operations associated with the first data and the second data, respectively. Further, the injection logic circuit is configured to inject, based on the error data and the trigger signal after accessing the memory, an error in at least one of the first data and the second data to generate at least one of erroneous first data and erroneous second data, respectively. The error detection circuit is configured to receive at least one of the erroneous first data and the erroneous second data, and detect the error in at least one of the erroneous first data and the erroneous second data to generate an error signal.

The injection logic circuit accesses the memory based on the read and write access requests generated by the error injection controller. Thus, the injection logic circuit consumes less time to access the memory for performing error injection as compared to conventional error injection systems that execute initialization instructions. Further, the injection logic circuit has a less complex design as IP cores of the SoC need not be configured for accessing the memory. As a result, a speed of operation of the SoC improves as compared to the conventional error injection systems.

BRIEF DESCRIPTION OF THE DRAWINGS

The following detailed description of the preferred embodiments of the present disclosure will be better understood when read in conjunction with the appended drawings.

The present disclosure is illustrated by way of example, and not limited by the accompanying figures, in which like references indicate similar elements.

FIGS. 5A-5E, collectively, represent a flow chart that illustrates an error injection method to inject an error in the SoC of FIG. 1 in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
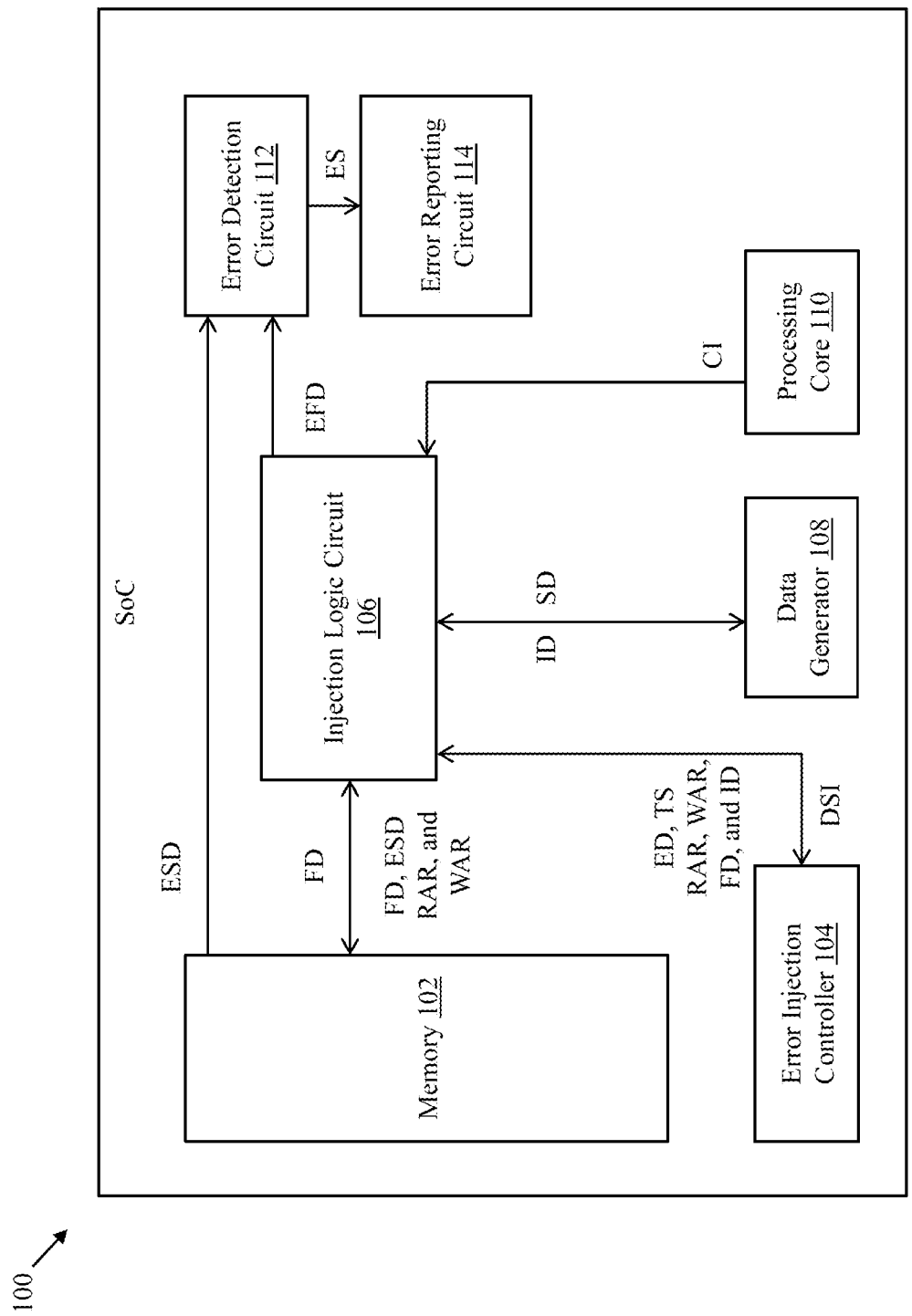
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 may be utilized in an automotive application (e.g., an advanced driver assistance system), a consumer application (e.g., a home security system), an industrial application (e.g., an industrial robotic system), or the like. The SoC 100 includes a memory 102, an error injection controller 104, an injection logic circuit 106, a data generator 108, a processing core 110, an error detection circuit 112, and an error reporting circuit 114.

The memory 102 is a main memory of the SoC 100. The memory 102 is associated with the processing core 110 to execute a set of memory operations (such as read and write operations). In one embodiment, the memory 102 includes a set of memory mapped segments (not shown) such that the processing core 110 may directly access the memory 102 to execute the set of memory operations. In another embodiment, the memory 102 includes a set of non-memory mapped segments (not shown) such that the processing core 110 may access the memory 102 by way of a memory access request to execute the set of memory operations. In one example, the memory 102 is a volatile memory such as a random access memory.

The error injection controller 104 may include suitable circuitry that is configured to perform one or more operations. The error injection controller 104 is coupled with the memory 102 by way of the injection logic circuit 106. Further, the error injection controller 104 is configured to generate error data ED, a trigger signal TS, and at least one of read and write access requests RAR and WAR associated with the memory 102. The error data ED is utilized to inject error in data that is written to or read from the memory 102. The trigger signal TS is indicative of initiating error injection in the data that is written to or read from the memory 102. The read and write access requests RAR and WAR correspond to access requests associated with the memory 102 to execute read and write operations, respectively.

The error injection controller 104 is further configured to generate first data FD, input data ID, and read and write addresses (not shown). In one example, the first data FD and the input data ID and the read and write addresses are associated with the read and write access requests RAR and WAR and the read and write operations, respectively. Further, the error injection controller 104 is configured to receive data status information DSI that is indicative of a status of error injection in the data that is written to or read from the memory 102. In one example, the data status information DSI is indicative of completion of error injection and includes the error injected data. In one embodiment, the error injection controller 104 includes a set of registers (not shown) that includes an error register, a trigger register, a data register, an address register, an access register, and a status register. The error register is configured to store and output the error data ED. The trigger register is configured to generate and output the trigger signal TS. The data register is configured to store and output one of the first data FD and the input data ID. The address register is configured to store and output one of the read and write addresses. The access register is configured to generate and output one of the read and write access requests RAR and WAR. The status register is configured to receive and store the data status information DSI.

The injection logic circuit 106 is coupled with the error injection controller 104, and configured to receive the error data ED, the trigger signal TS, and at least one of the read and write access requests RAR and WAR associated with the memory 102. The injection logic circuit 106 is further configured to receive at least one of the first data FD and the input data ID and the read and write addresses when the injection logic circuit 106 receives the read access request RAR and the write access request WAR, respectively. In one embodiment, the injection logic circuit 106 is further configured to store the first data FD in the memory 102 when the injection logic circuit 106 receives the read access request RAR. The injection logic circuit 106 is further coupled with the memory 102, and configured to access the memory 102 based on the trigger signal TS and at least one of the read and write access requests RAR and WAR to execute at least one of the read and write operations associated with the first data FD and the input data ID. In one example, to execute at least one of the read and write operations, the injection logic circuit 106 is further configured to transmit at least one of the read and write access requests RAR and WAR to the memory 102 when the trigger signal TS is activated (i.e., is at logic high state).

The injection logic circuit 106 is further configured to output the input data ID and receive second data SD. The second data SD corresponds to a combination of the input data ID with error correction code (ECC) bits or parity bits. The injection logic circuit 106 is further configured to inject, based on the error data ED and the trigger signal TS after accessing the memory 102, an error in at least one of the first data FD and the second data SD to generate at least one of erroneous first data EFD and erroneous second data ESD, respectively. The erroneous first data EFD corresponds to the first data FD with the injected error. The erroneous second data ESD corresponds to the second data SD with the injected error. The injected error in at least one of the first data FD and the second data SD is one of a single-bit error and a multi-bit error. The single-bit and multi-bit errors may correspond to flipping of single bit and multiple bits of one of the first data FD and the second data SD. In one example, the multi-bit error corresponds to at least one of a two-bit error and a three-bit error.

When the injection logic circuit 106 receives the read access request RAR, the injection logic circuit 106 is configured to transmit the read access request RAR to the memory 102, and access the memory 102 to read the first data FD at the read address from the memory 102 (i.e., receive the first data FD from the memory 102). Further, the injection logic circuit 106 injects the error in the first data FD, based on the error data ED and the trigger signal TS, to generate the erroneous first data EFD. When the injection logic circuit 106 receives the write access request WAR, the injection logic circuit 106 injects the error in the second data SD, based on the error data ED and the trigger signal TS, to generate the erroneous second data ESD. Further, the injection logic circuit 106 is configured to transmit the write access request WAR to the memory 102, and access the memory 102 to write the erroneous second data ESD at the write address in the memory 102 (i.e., transmit the erroneous second data ESD to the memory 102). In one embodiment, the memory 102 is further configured to receive and store the erroneous second data ESD at the write address. Thus, the error injection controller 104 and the injection logic circuit 106 together form a system for error injection in the SoC 100.

The data generator 108 may include suitable circuitry that is configured to perform one or more operations. The data generator 108 is coupled with the injection logic circuit 106, and configured to receive the input data ID from the injection logic circuit 106 and generate the second data SD. In one embodiment, the data generator 108 generates the second data SD by combining the input data ID with the ECC bits. In another embodiment, the data generator 108 generates the second data SD by combining the input data ID with parity bits. The data generator 108 is further configured to transmit the second data SD to the injection logic circuit 106.

It will be apparent to a person skilled in the art that although in the current embodiment, the error injection controller 104, the injection logic circuit 106, the data generator 108, and the error detection circuit 112 are external to the processing core 110, the scope of the present disclosure is not limited to it. In various other embodiments, the error injection controller 104, the injection logic circuit 106, the data generator 108, and the error detection circuit 112 may be internal to the processing core 110, without deviating from the scope of the present disclosure.

The processing core 110 may include suitable circuitry that is configured to perform one or more operations. The processing core 110 is coupled with the injection logic circuit 106, and configured to generate control information CI to execute the set of memory operations. The control information CI includes at least one of control data (not shown), a memory address (not shown) of the memory 102, and a memory access request (not shown). The control data corresponds to at least one of data to be written to and data to be read from a memory location associated with the memory address based on the memory access request. The processing core 110 is further configured to transmit the control information CI to the injection logic circuit 106 for executing the set of memory operations. In one embodiment, the data generator 108 is coupled with the processing core 110, and configured to receive the control information CI and further generate and transmit the control information CI combined with the ECC or parity bits to the injection logic circuit 106. In one example, the processing core 110 is an intellectual property core of the SoC 100.

The error detection circuit 112 may include suitable circuitry that is configured to perform one or more operations. The error detection circuit 112 is coupled with the memory 102 and the injection logic circuit 106, and configured to receive the erroneous first data EFD from the injection logic circuit 106 and the erroneous second data ESD from the memory 102. The error detection circuit 112 is further configured to detect the error in at least one of the erroneous first data EFD and the erroneous second data ESD based on at least one of the ECC and parity bits associated with at least one of the erroneous first data EFD and the erroneous second data ESD, respectively. In one example, the error detection circuit 112 detects the error further based on an error syndrome (not shown). Further, the error detection circuit 112 detects the error in at least one of the erroneous first data EFD and the erroneous second data ESD to generate an error signal ES. The error signal ES indicates at least one of single-bit and multi-bit errors present in at least one of the erroneous first data EFD and the erroneous second data ESD. In one embodiment, the error detection circuit 112 is further configured to receive the read and write addresses from the injection logic circuit 106. In one example, the error detection circuit 112 is further configured to output the error signal ES, the error syndrome, and at least one of the read and write addresses as an error address (not shown) associated with the erroneous first data EFD or the erroneous second data ESD.

The error reporting circuit 114 may include suitable circuitry that is configured to perform one or more operations. The error reporting circuit 114 is coupled with the error detection circuit 112, and configured to receive the error signal ES from the error detection circuit 112 and identify, based on the error signal ES, at least one of the single-bit and multi-bit errors as the detected error. Further, the error reporting circuit 114 is configured to correct the single-bit, and reset the SoC 100 when the error reporting circuit 114 identifies the multi-bit error. The error reporting circuit 114 includes an error reporter (not shown) and a fault control circuit (not shown).

It will be apparent to a person skilled in the art that although in the current embodiment, the error reporting circuit 114 corrects the single-bit error, and resets the SoC 100 when the error reporting circuit 114 identifies the multi-bit error, the scope of the present disclosure is not limited to it. In various other embodiments, the error reporting circuit 114 is configured to correct at least one of the single-bit and two-bit errors, and reset the SoC 100 when the error reporting circuit 114 identifies the three-bit error, without deviating from the scope of the present disclosure.

The error reporter is coupled with the error detection circuit 112, and configured to receive the error signal ES from the error detection circuit 112 and identify, based on the error signal ES, at least one of the single-bit and multi-bit errors as the detected error. In one embodiment, the error reporter is further configured to correct the single-bit error indicated by the error signal ES, and generate a reporting signal (not shown) when the error signal ES indicates the multi-bit error (i.e., the two-bit error and the three-bit error). In another embodiment, the error reporter is further configured to correct the single-bit and two-bit errors when the error signal ES indicates the single-bit and two-bit errors, respectively, and generate the reporting signal when the error signal ES indicates the three-bit error.

The fault control circuit is coupled with the error reporter, and configured to receive the reporting signal and execute a corrective action such as resetting the SoC 100 based on the reporting signal. In one embodiment, the fault control circuit is further configured to reset the SoC 100 when the reporting signal indicates the multi-bit error (i.e., at least one of the two-bit error and the three-bit error). In another embodiment, the fault control circuit is further configured to reset the SoC 100 when the reporting signal indicates the three-bit error. Thus, the error injection controller 104, the injection logic circuit 106, and the error reporting circuit 114 together form a testing system to test whether the error detection circuit 112 is able to identify the injected errors in at least one of the first data FD and the second data SD correctly.

Figure 2:
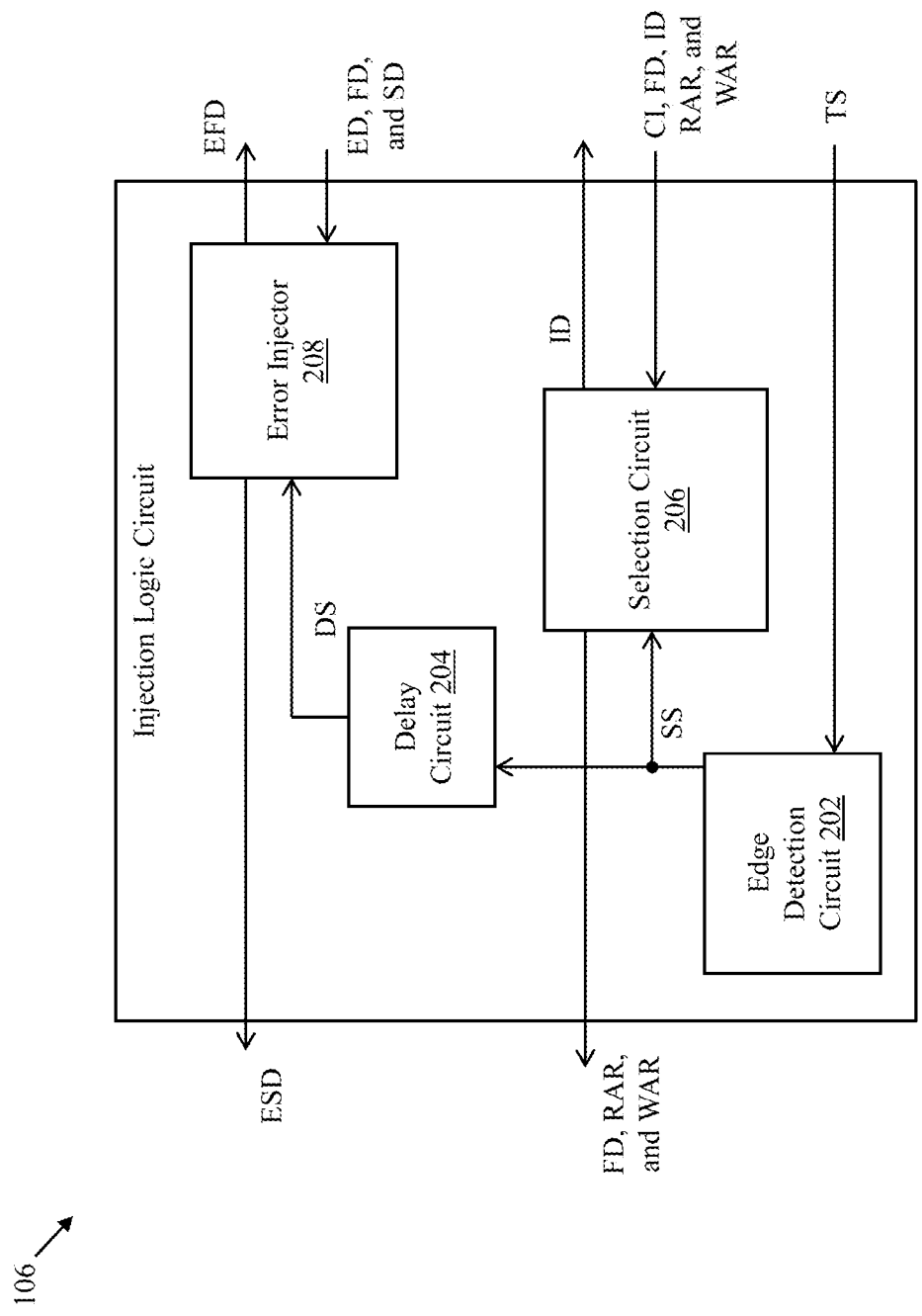
FIG. 2 illustrates a schematic block diagram of an injection logic circuit of the SoC of FIG. 1 in accordance with an embodiment of the present disclosure.

FIG. 2 illustrates a schematic block diagram of the injection logic circuit 106 in accordance with an embodiment of the present disclosure. The injection logic circuit 106 includes an edge detection circuit 202, a delay circuit 204, a selection circuit 206, an error injector 208.

The edge detection circuit 202 may include suitable circuitry that is configured to perform one or more operations. The edge detection circuit 202 is coupled with the error injection controller 104, and configured to receive the trigger signal TS from the error injection controller 104. Further, the edge detection circuit 202 is configured to detect an edge of the trigger signal TS and generate a select signal SS based on the detected edge of the trigger signal TS. In one example, the edge detection circuit 202 generates the select signal SS at logic high state when it detects a positive edge of the trigger signal TS. In another example, the edge detection circuit 202 generates the select signal SS at logic high state when it detects a negative edge of the trigger signal TS.

The delay circuit 204 may include suitable circuitry that is configured to perform one or more operations. The delay circuit 204 is coupled with the edge detection circuit 202, and configured to receive the select signal SS from the edge detection circuit 202. Further, the delay circuit 204 is configured to delay the select signal SS by a predetermined value to generate a delay signal DS.

The selection circuit 206 may include suitable circuitry that is configured to perform one or more operations. The selection circuit 206 is coupled with the edge detection circuit 202, the error injection controller 104, and the processing core 110, and configured to receive the select signal SS, the control information CI, and at least one of the read and write access requests RAR and WAR. Further, the selection circuit 206 is coupled with the memory 102, and configured to select and transmit, based on the select signal SS, one of the control information CI and at least one of the read and write access requests RAR and WAR to the memory 102. In one example, the selection circuit 206 selects and transmits the control information CI to the memory 102 to execute the set of memory operations when the select signal SS is at logic low state, and the selection circuit 206 selects and transmits at least one of the read and write access requests RAR and WAR to the memory 102 when the select signal SS is at logic high state.

When the selection circuit 206 receives the read access request RAR from the error injection controller 104, the selection circuit 206 selects and outputs the read access request RAR based on the select signal SS. When the selection circuit 206 outputs the read access request RAR, the selection circuit 206 is further configured to receive the first data FD and the read address from the error injection controller 104, and transmit the first data FD to the memory 102 and the read address to the error detection circuit 112. When the selection circuit 206 receives the write access request WAR from the error injection controller 104, the selection circuit 206 selects and outputs the write access request WAR based on the select signal SS. When the selection circuit 206 outputs the write access request WAR, the selection circuit 206 is further configured to receive the input data ID and the write address from the error injection controller 104, and transmit the input data ID to the data generator 108, and the write address to the error detection circuit 112. In one example, the selection circuit 206 is implemented by way of a multiplexer.

The error injector 208 may include suitable circuitry that is configured to perform one or more operations. The error injector 208 is coupled with the delay circuit 204, the error injection controller 104, the memory 102, and the data generator 108, and configured to receive the delay signal DS, the first data FD, the second data SD, and the error data ED. Further, the error injector 208 is configured to inject the error in at least one of the first data FD and the second data SD based on the error data ED and the delay signal DS to generate at least one of the erroneous first data EFD and the erroneous second data ESD, respectively. In one embodiment, the error injector 208 injects the error in at least one of the first data FD and the second data SD when the delay signal DS is at logic high state. The error injector 208 is further coupled with the error detection circuit 112, and further configured to transmit the erroneous first data EFD to the error detection circuit 112. The error injector 208 is further configured to transmit the erroneous second data ESD to the memory 102. The memory 102 is further configured to receive and store the erroneous second data ESD at the write address of the memory 102 associated with the write access request WAR. In one example, the error injector 208 is implemented by way of a set of XOR gates.

In operation, the processing core 110 is configured to generate and transmit the control information CI to the injection logic circuit 106 for executing the set of memory operations. The error injection controller 104 is configured to generate and transmit the error data ED, the trigger signal TS, and at least one of the read and write access requests RAR and WAR to the injection logic circuit 106. When the trigger signal TS is at logic low state, the selection circuit 206 selects and transmits the control information CI to the memory 102. To initiate the error injection, the error injection controller 104 generates the trigger signal TS at logic high state. When the trigger signal TS is at logic high state, the selection circuit 206 selects and transmits at least one of the read and write access requests RAR and WAR to the memory 102.

In one embodiment, the error injection controller 104 generates and transmits the read access request RAR to the selection circuit 206, and the trigger signal TS at logic high state to the edge detection circuit 202. The edge detection circuit 202 generates the select signal SS at logic high state based on the trigger signal TS and transmits the select signal SS at logic high state to the selection circuit 206. On receiving the select signal SS at logic high state, the selection circuit 206 selects and outputs the read access request RAR. When the selection circuit 206 outputs the read access request RAR, the selection circuit 206 further receives the first data FD and the read address from the error injection controller 104. The selection circuit 206 stores the first data FD at the read address in the memory 102. Further, the selection circuit 206 transmits the read access request RAR to the memory 102 to execute the read operation on the memory 102.

Based on the read access request RAR, the error injector 208 receives the first data FD from the memory 102. The delay circuit 204 receives the select signal SS and generates and transmits the delay signal DS to the error injector 208. Based on the delay signal DS, the error injector 208 injects the error in the first data FD to generate the erroneous first data EFD. The error injector 208 may further generate the data status information DSI and transmit the data status information DSI to the error injection controller 104. The error detection circuit 112 receives the erroneous first data EFD from the memory 102 and detects the error in the erroneous first data EFD to generate the error signal ES. In one example, when the error signal ES correctly indicates the single-bit or multi-bit error in the erroneous first data EFD, the error detection circuit 112 is correctly able to detect the error and hence is operating normally. In another example, when the error signal ES incorrectly indicates the single-bit or multi-bit error in the erroneous first data EFD, the error detection circuit 112 is unable to detect the error correctly and hence is faulty or damaged.

In another embodiment, the error injection controller 104 generates and transmits the write access request WAR to the selection circuit 206, and the trigger signal TS at logic high state to the edge detection circuit 202. The edge detection circuit 202 generates the select signal SS at logic high state based on the trigger signal TS and transmits the select signal SS at logic high state to the selection circuit 206. On receiving the select signal SS at logic high state, the selection circuit 206 selects and outputs the write access request WAR. When the selection circuit 206 outputs the write access request WAR, the selection circuit 206 further receives the input data ID and the write address from the error injection controller 104. The selection circuit 206 transmits the input data ID to the data generator 108. The data generator 108 receives the input data ID and generates and transmits the second data SD to the error injector 208.

The delay circuit 204 receives the select signal SS and generates and transmits the delay signal DS to the error injector 208. Based on the delay signal DS, the error injector 208 injects the error in the second data SD to generate the erroneous second data ESD. The error injector 208 may further generate the data status information DSI and transmit the data status information DSI to the error injection controller 104. The selection circuit 206 transmits the write access request WAR to the memory 102 to execute the write operation on the memory 102. The selection circuit 206 stores (i.e., writes) the erroneous second data ESD at the write address in the memory 102.

The error detection circuit 112 receives the erroneous second data ESD from the memory 102 and detects the error in the erroneous second data ESD to generate the error signal ES. In one example, when the error signal ES correctly indicates the single-bit or multi-bit error in the erroneous second data ESD, the error detection circuit 112 is correctly able to detect the error and hence is operating normally. In another example, when the error signal ES incorrectly indicates the single-bit or multi-bit error in the erroneous second data ESD, the error detection circuit 112 is unable to detect the error correctly and hence is faulty or damaged.

The error reporting circuit 114 receives the generated error signal ES based on at least one of the erroneous first data EFD and the erroneous second data ESD from the error detection circuit 112. The error reporting circuit 114 identifies at least one of the single-bit and multi-bit errors indicated by the error signal ES, and corrects the single-bit error indicated by the error signal ES. Further, the error reporting circuit 114 resets the SoC 100 when the error reporting circuit 114 identifies the multi-bit error indicated by the error signal ES.

Figure 3:
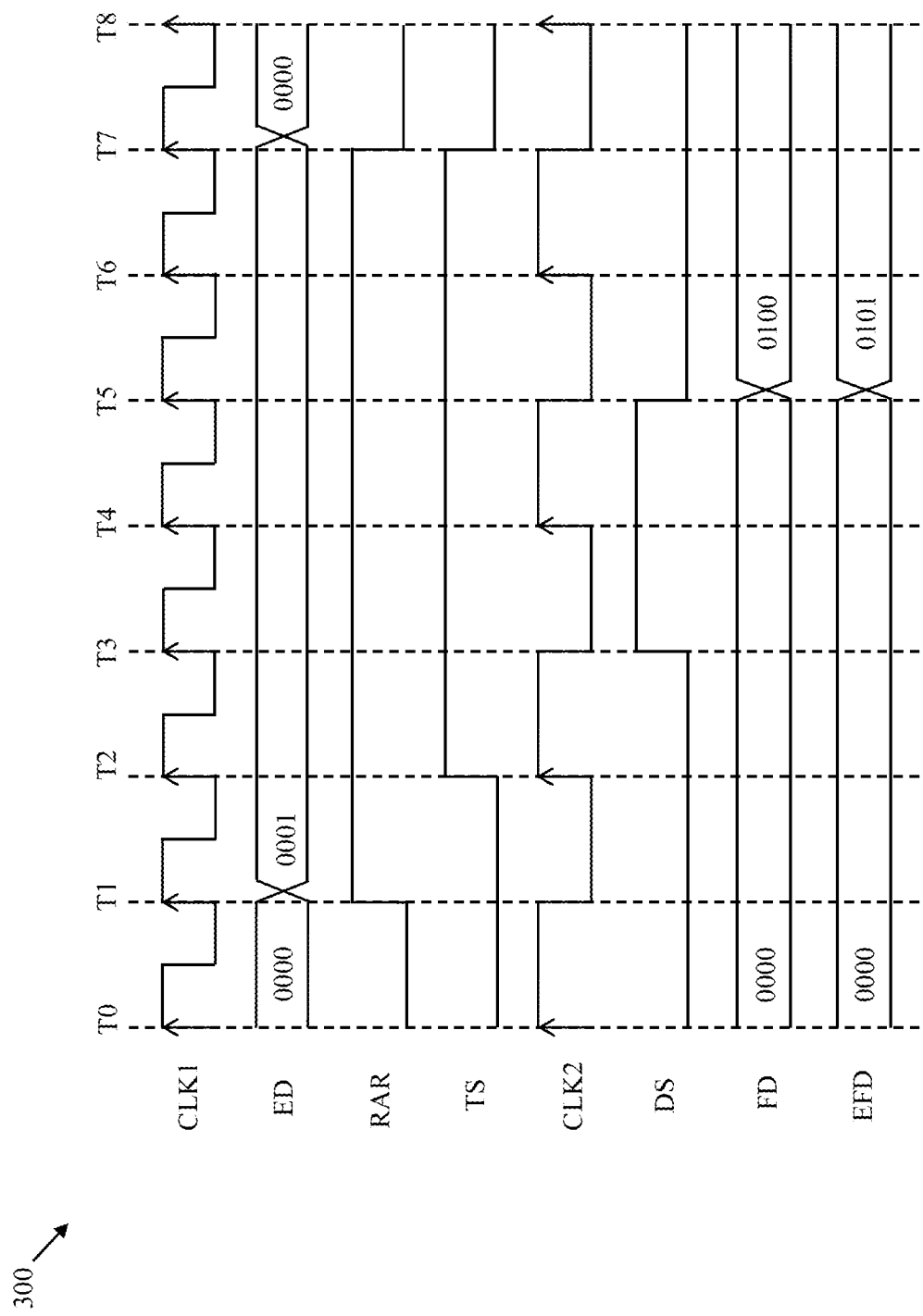
FIG. 3 is a timing diagram that illustrates error injection during a read operation of the SoC of FIG. 1 in accordance with an embodiment of the present disclosure.

FIG. 3 is a timing diagram 300 that illustrates error injection during the read operation of the SoC 100 in accordance with an embodiment of the present disclosure. The error injection controller 104 operates on a first clock signal CLK1 and the memory 102 operates on a second clock signal CLK2. In one embodiment, frequencies of the first and second clock signals CLK1 and CLK2 are equal. In another embodiment, the frequencies of the first and second clock signals CLK1 and CLK2 are different. For the sake of ongoing discussion, it is assumed that the frequencies of the first and second clock signals CLK1 and CLK2 are different. In one example, a clock generator (not shown) of the SoC 100 generates the first and second clock signals CLK1 and CLK2.

During time period T0-T1, the error injection controller 104 operates in synchronization with the first clock signal CLK1 (i.e., outputs corresponding data at the positive edge of the first clock signal CLK1). The memory 102 operates in synchronization with the second clock signal CLK2 (i.e., outputs corresponding data at the positive edge of the second clock signal CLK2). The first clock signal CLK1 completes one cycle and the second clock signal CLK2 completes a positive half cycle during the time period T0-T1. The read access request RAR, the trigger signal TS, and the delay signal DS are at logic low state. Further, a value of each of the error data ED, the first data FD, and the erroneous first data EFD is '0000'.

At time instance T1, the read access request RAR transitions from logic low state to logic high state, and the trigger signal TS and the delay signal DS remain at logic low state. During the time period T1-T2, the first clock signal CLK1 completes one cycle and the second clock signal CLK2 completes a negative half cycle. The read access request RAR remains at logic high state, and the trigger signal TS and the delay signal DS remain at logic low state. The error injection controller 104 generates and transmits the error data ED (i.e., '0001') to the error injector 208. The selection circuit 206 is configured to receive the read access request RAR and access the memory 102 for the execution of the read operation. Further, the value of each of the first data FD and the erroneous first data EFD remains '0000'.

At time instance T2, the trigger signal TS transitions from logic low state to logic high state, the read access request RAR remains at logic high state, and the delay signal DS remains at logic low state. During time period T2-T3, the first clock signal CLK1 completes one cycle and the second clock signal CLK2 completes a positive half cycle. The trigger signal TS and the read access request RAR remain at logic high state, and the delay signal DS remains at logic low state. The edge detection circuit 202 detects the rising edge of the trigger signal TS and generates the select signal SS. The selection circuit 206 outputs the read access request RAR to access the memory 102 for the execution of the read operation. Further, the value of the error data ED remains '0001', and the value of each of the first data FD and the erroneous first data EFD remains '0000'.

At time instance T3, the delay signal DS transitions from logic low state to logic high state, and the read access request RAR and the trigger signal TS remain at logic high state. During time period T3-T5, the first clock signal CLK1 completes two cycles and the second clock signal CLK2 completes one cycle. The trigger signal TS, the read access request RAR, and the delay signal DS remain at logic high state. The delay circuit 204 transmits the delay signal DS, after the predetermined time period (i.e., the time period T2-T3), to the error injector 208. Further, the value of the error data ED remains '0001', and the value of each of the first data FD and the erroneous first data EFD remains '0000'.

At time instance T5, the delay signal DS transitions from logic high state to logic low state, and the read access request RAR and the trigger signal TS remain at logic high state. During time period T5-T7, the first clock signal CLK1 completes two cycles and the second clock signal CLK2 completes one cycle. The trigger signal TS and the read access request RAR remain at logic high state, and the delay signal DS remains at logic low state. The error injector 208 receives the first data FD (i.e., '0100') from the memory 102 based on the read access request RAR, and injects the error in the first data FD to generate the erroneous first data EFD (i.e., '0101'). Thus, the error injected in the first data FD is a single-bit error. Further, the value of the error data ED remains '0001'.

At time instance T7, the trigger signal TS and the read access request RAR transition from logic high state to logic low state, and the delay signal DS remains at logic low state. During time period T7-T8, the first clock signal CLK1 completes one cycle and the second clock signal CLK2 completes a negative half cycle. The trigger signal TS, the read access request RAR, and the delay signal DS remain at logic low state. Thus, the error injection in the first data FD is completed. Further, the value of the error data ED is '0000', the value of the first data FD remains '0100', and the value of the erroneous first data EFD remains '0101'.

Figure 4:
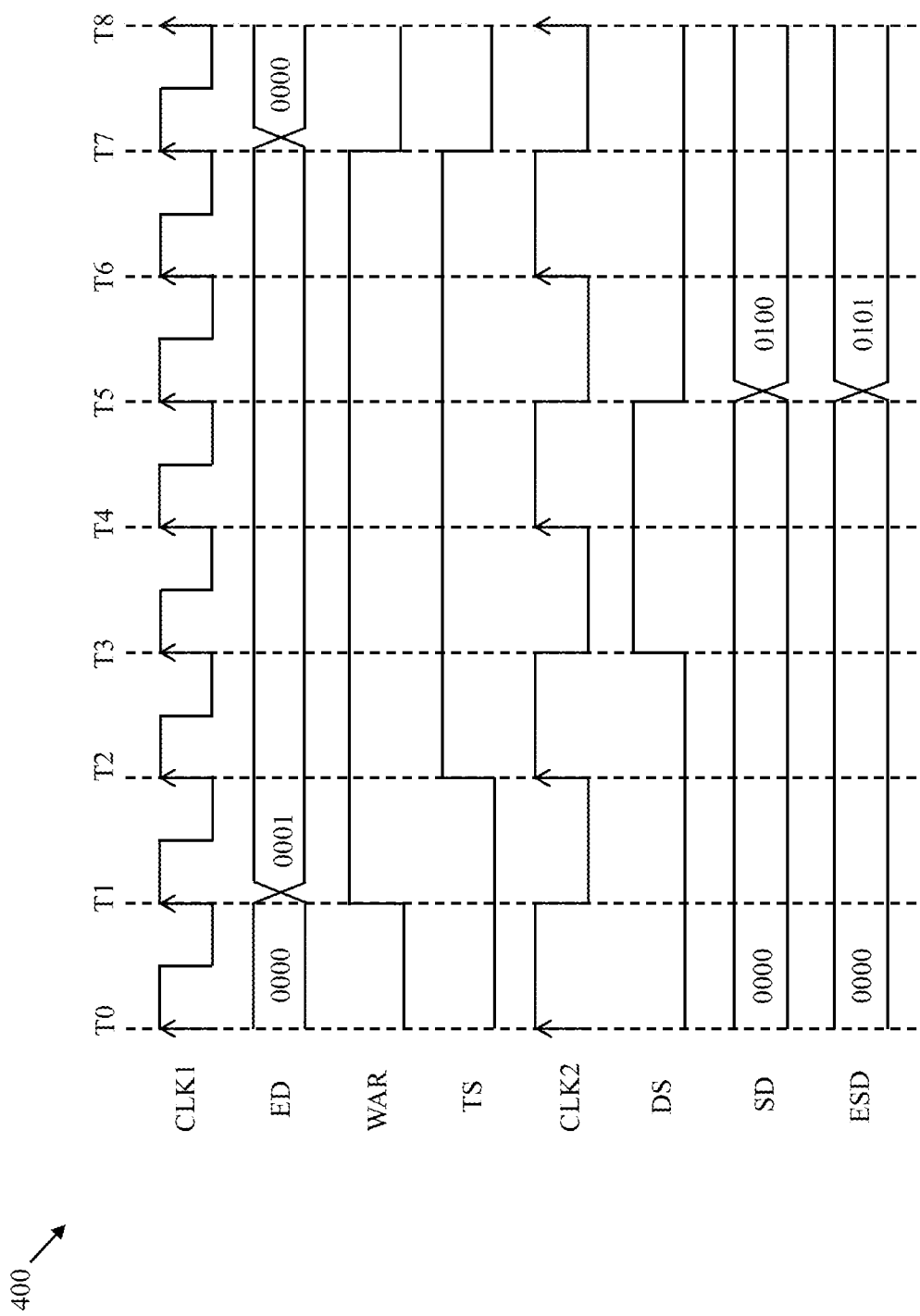
FIG. 4 is a timing diagram that illustrates error injection during a write operation of the SoC of FIG. 1 in accordance with an embodiment of the present disclosure.

FIG. 4 is a timing diagram 400 that illustrates error injection during the write operation of the SoC 100 in accordance with an embodiment of the present disclosure. The error injection controller 104 operates on the first clock signal CLK1 and the memory 102 operates on the second clock signal CLK2. In one embodiment, the frequencies of the first and second clock signals CLK1 and CLK2 are equal. In another embodiment, the frequencies of the first and second clock signals CLK1 and CLK2 are different. For the sake of ongoing discussion, it is assumed that the frequencies of the first and second clock signals CLK1 and CLK2 are different.

During time period T0-T1, the error injection controller 104 operates in synchronization with the first clock signal CLK1 (i.e., outputs corresponding data at the positive edge of the first clock signal CLK1). The memory 102 operates in synchronization with the second clock signal CLK2 (i.e., outputs corresponding data at the positive edge of the second clock signal CLK2). The first clock signal CLK1 completes one cycle and the second clock signal CLK2 completes a positive half cycle during the time period T0-T1. The write access request WAR, the trigger signal TS, and the delay signal DS are at logic low state. Further, a value of each of the error data ED, the second data SD, and the erroneous second data ESD is '0000'.

At time instance T1, the write access request WAR transitions from logic low state to logic high state, and the trigger signal TS and the delay signal DS remain at logic low state. During the time period T1-T2, the first clock signal CLK1 completes one cycle and the second clock signal CLK2 completes a negative half cycle. The write access request WAR remains at logic high state, and the trigger signal TS and the delay signal DS remain at logic low state. The error injection controller 104 generates and transmits the error data ED (i.e., '0001') to the error injector 208. The selection circuit 206 is configured to receive the write access request WAR and access the memory 102 for the execution of the write operation. Further, the value of each of the second data SD and the erroneous second data ESD remains '0000'.

At time instance T2, the trigger signal TS transitions from logic low state to logic high state, the write access request WAR remains at logic high state, and the delay signal DS remains at logic low state. During time period T2-T3, the first clock signal CLK1 completes one cycle and the second clock signal CLK2 completes a positive half cycle. The trigger signal TS and the write access request WAR remain at logic high state, and the delay signal DS remains at logic low state. The edge detection circuit 202 detects the rising edge of the trigger signal TS and generates the select signal SS. The selection circuit 206 outputs the write access request WAR to access the memory 102 for the execution of the read operation. Further, the value of the error data ED remains '0001', and the value of each of the second data SD and the erroneous second data ESD remains '0000'.

At time instance T3, the delay signal DS transitions from logic low state to logic high state, and the write access request WAR and the trigger signal TS remain at logic high state. During time period T3-T5, the first clock signal CLK1 completes two cycles and the second clock signal CLK2 completes one cycle. The trigger signal TS, the write access request WAR, and the delay signal DS remain at logic high state. The delay circuit 204 transmits the delay signal DS, after the predetermined time period (i.e., the time period T2-T3), to the error injector 208. Further, the value of the error data ED remains '0001', and the value of each of the second data SD and the erroneous second data ESD remains '0000'.

At time instance T5, the delay signal DS transitions from logic high state to logic low state, and the write access request WAR and the trigger signal TS remain at logic high state. During time period T5-T7, the first clock signal CLK1 completes two cycles and the second clock signal CLK2 completes one cycle. The trigger signal TS and the write access request WAR remain at logic high state, and the delay signal DS remains at logic low state. The error injector 208 receives the second data SD (i.e., '0100') from the data generator 108, and injects the error in the second data SD to generate the erroneous second data ESD (i.e., '0101'). Thus, the error injected in the second data SD is single-bit error. The error injector 208 stores (i.e., writes) the erroneous second data ESD in the memory 102 based on the write access request WAR. Further, the value of the error data ED remains '0001'.

At time instance T7, the trigger signal TS and the write access request WAR transition from logic high state to logic low state, and the delay signal DS remains at logic low state. During time period T7-T8, the first clock signal CLK1 completes one cycle and the second clock signal CLK2 completes a negative half cycle. The trigger signal TS, the write access request WAR, and the delay signal DS remain at logic low state. Thus, the error injection in the second data SD is completed. Further, the value of the error data ED is '0000', the value of the second data SD remains '0100', and the value of the erroneous second data ESD remains '0101'.

FIGS. 5A-5E, collectively, represent a flow chart 500 that illustrates an error injection method to inject an error in the SoC 100 in accordance with an embodiment of the present disclosure. The SoC 100 may perform normal operations (such as the set of memory operations) with the processing core 110. The error injection controller 104 may initiate the error injection after pre-defined time intervals during the operation of the SoC 100. For the sake of ongoing discussion, it is assumed that the error injection controller 104 has initiated error injection during at least one of read and write operations.

Figure 5A:
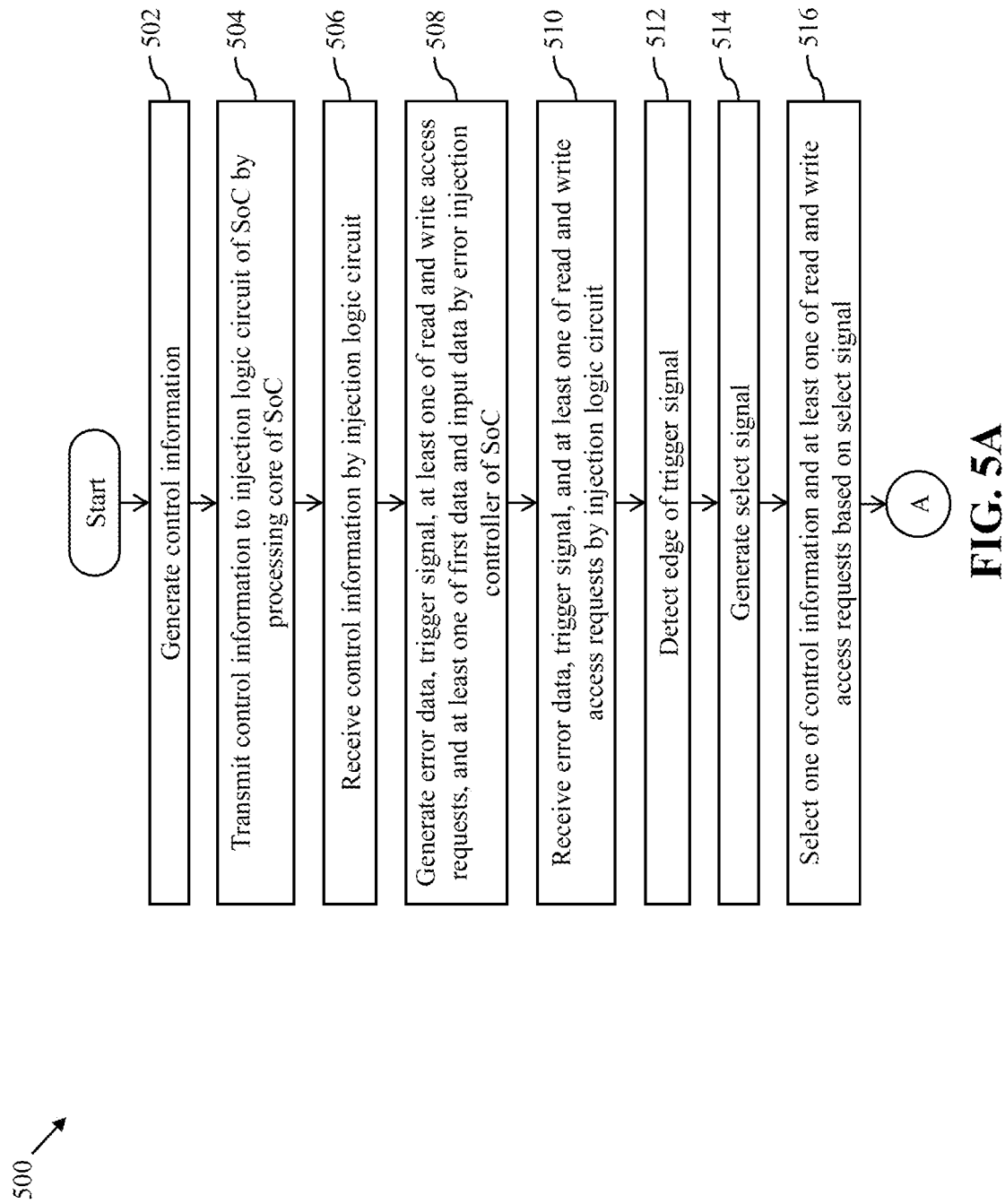

Referring now to FIG. 5A, at step 502, the processing core 110 generates the control information CI. At step 504, the processing core 110 transmits the control information CI to the injection logic circuit 106. At step 506, the injection logic circuit 106 receives the control information CI for the execution of the set of memory operations corresponding to the processing core 110. At step 508, the error injection controller 104 generates the error data ED, the trigger signal TS, at least one of the read and write access requests RAR and WAR, and at least one of the first data FD and the input data ID.

At step 510, the injection logic circuit 106 receives the error data ED, the trigger signal TS, and at least one of the read and write access requests RAR and WAR. At step 512, the injection logic circuit 106 detects the edge of the trigger signal TS. At step 514, the injection logic circuit 106 generates and transmits the select signal SS to the selection circuit 206 and the delay circuit 204. The injection logic circuit 106 generates the select signal SS based on the detected edge of the trigger signal TS. At step 516, the injection logic circuit 106 selects one of the control information CI and at least one of the read and write access requests RAR and WAR based on the select signal SS.

Figure 5B:
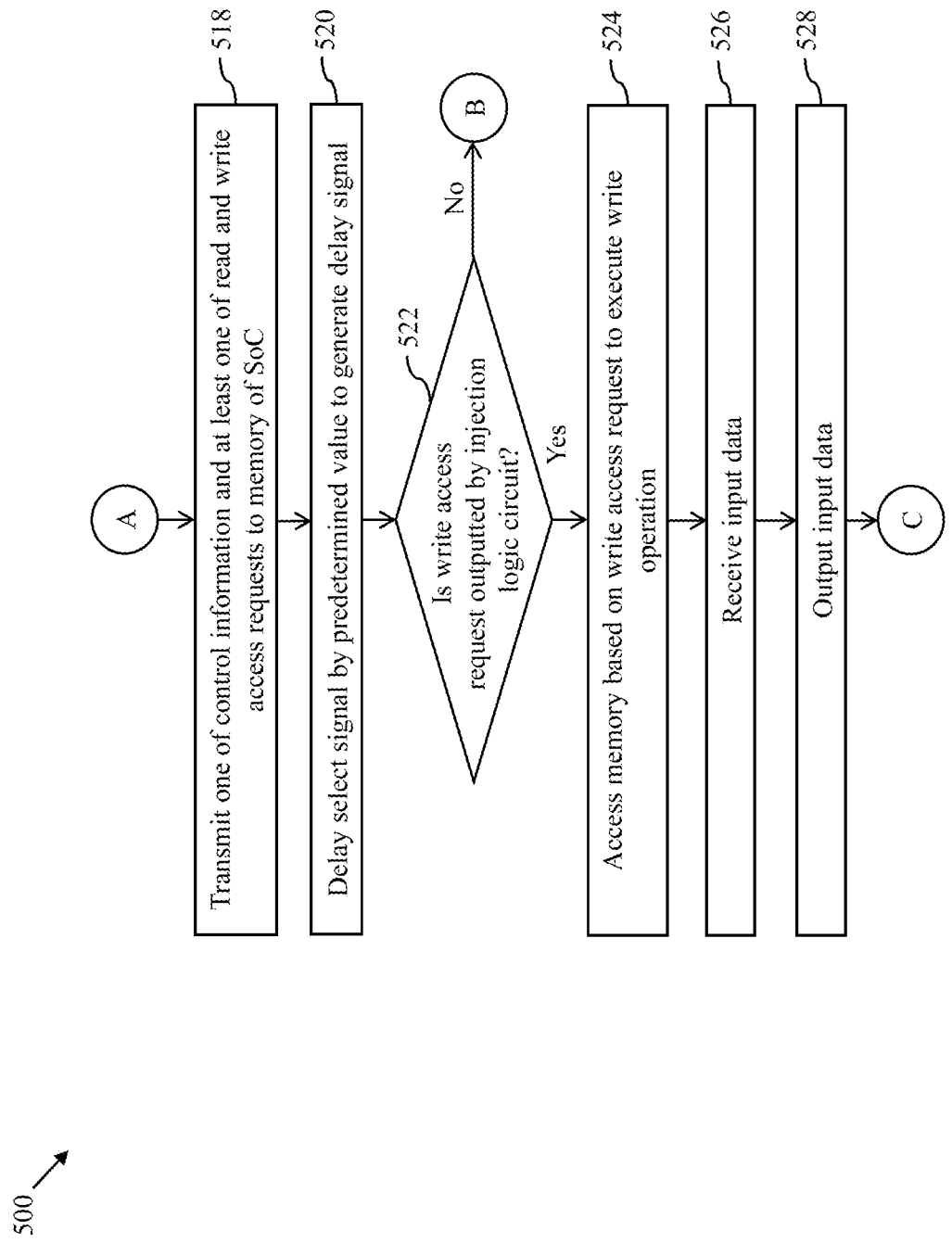

Referring now to FIG. 5B, at step 518, the injection logic circuit 106 transmits (i.e., outputs) one of the control information CI and at least one of the read and write access requests RAR and WAR to the memory 102. At step 520, the injection logic circuit 106 delays the select signal SS by the predetermined value to generate the delay signal DS.

At step 522, the injection logic circuit 106 determines whether the write access request WAR is outputted. If at step 522, the injection logic circuit 106 determines that the write access request WAR is outputted, step 524 is executed. At step 524, the injection logic circuit 106 accesses the memory 102 based on the write access request WAR to execute the write operation. At step 526, the injection logic circuit 106 receives the input data ID from the error injection controller 104. At step 528, the selection circuit 206 outputs the input data ID.

Referring now to FIG. 5C, at step 530, the data generator 108 receives the input data ID from the selection circuit 206. At step 532, the data generator 108 generates the second data SD corresponding to the write operation. At step 534, the data generator 108 transmits the second data SD to the injection logic circuit 106. At step 536, the injection logic circuit 106 receives the second data SD from the data generator 108.

At step 538, the injection logic circuit 106 injects the error in the second data SD to generate the erroneous second data ESD. The injection logic circuit 106 injects the error in the second data SD after accessing the memory 102 based on the write access request WAR. At step 540, the injection logic circuit 106 transmits the erroneous second data ESD to the memory 102. At step 542, the memory 102 receives the erroneous second data ESD. At step 544, the memory 102 stores the erroneous second data ESD at the write address, thereby completing the write operation. If at step 522, the injection logic circuit 106 determines that the write access request WAR is not outputted (i.e., the read access request RAR is outputted), step 546 is executed.

Figure 5D:
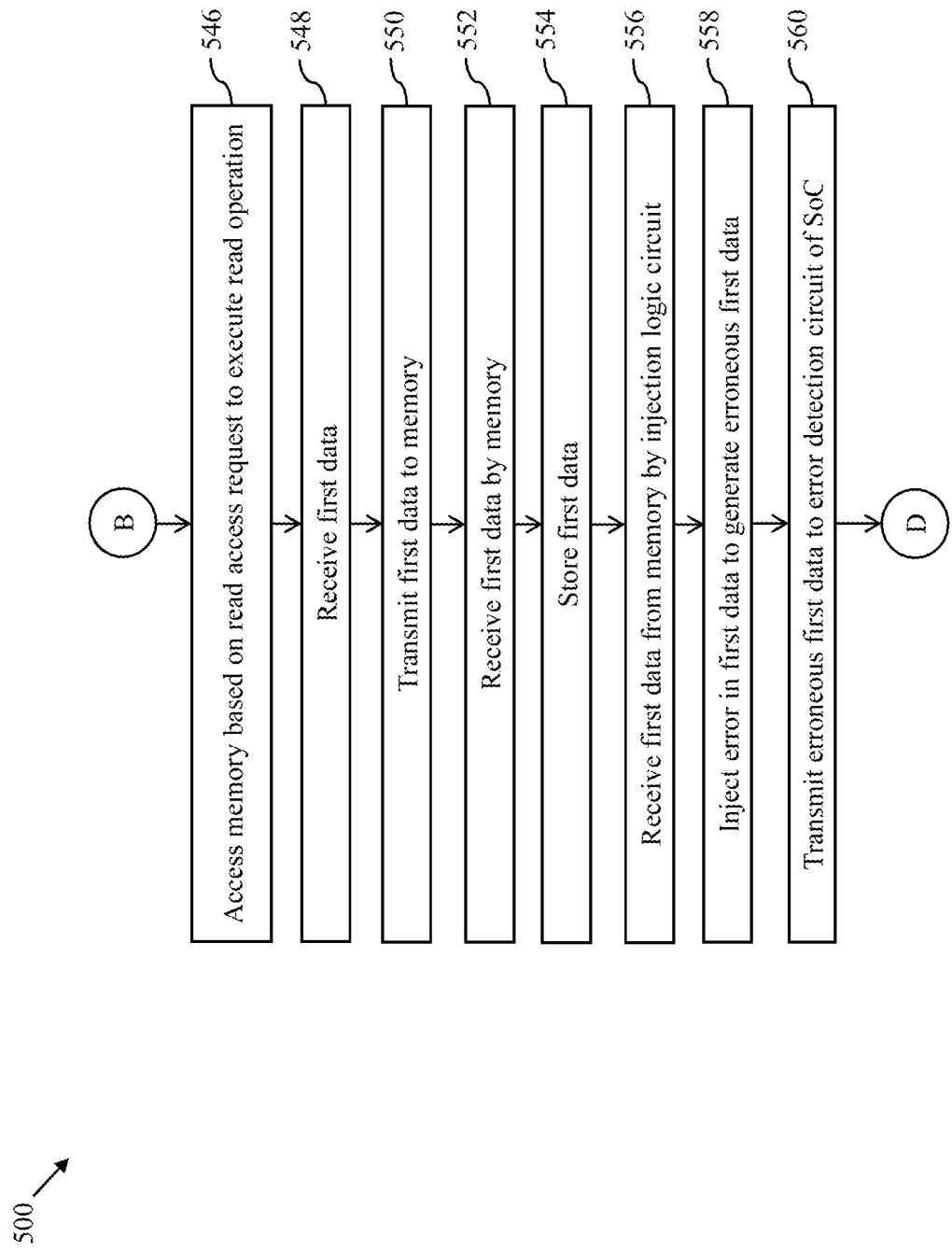

Referring now to FIG. 5D, at step 546, the injection logic circuit 106 accesses the memory 102 based on the read access request RAR to execute the read operation. At step 548, the injection logic circuit 106 receives the first data FD from the error injection controller 104. At step 550, the injection logic circuit 106 transmits the first data FD to the memory 102. At step 552, the memory 102 receives the first data FD. At step 554, the memory 102 stores the first data FD at the read address.

At step 556, the injection logic circuit 106 receives the first data FD from the memory 102 for error injection. At step 558, the injection logic circuit 106 injects the error in the first data FD to generate the erroneous first data EFD.

The injection logic circuit 106 injects the error in the first data FD after accessing the memory 102 based on the read access request RAR. At step 560, the injection logic circuit 106 transmits the erroneous first data EFD to the error detection circuit 112.

Referring now to FIG. 5E, at step 562, the error detection circuit 112 receives at least one of the erroneous first data EFD and the erroneous second data ESD. At step 564, the error detection circuit 112 detects the error in at least one of the erroneous first data EFD and the erroneous second data ESD. The error detection circuit 112, based on the detection of the error, generates the error signal ES. At step 566, the error reporting circuit 114 receives the error signal ES from the error detection circuit 112.

At step 568, the error reporting circuit 114 identifies, based on the error signal ES, at least one of single-bit and multi-bit errors as the detected error. At step 570, the error reporting circuit 114 corrects the single-bit error. At step 572, the error reporting circuit 114 resets the SoC 100 when the multi-bit error is identified.

The injection logic circuit 106 accesses the memory 102 based on the read and write access requests RAR and WAR generated by the error injection controller 104. Thus, the injection logic circuit 106 consumes less time to access the memory 102 for performing error injection as compared to conventional error injection systems. Further, the injection logic circuit 106 has a less complex design as compared to conventional error injection systems since the processing core 110 of the SoC 100 need not be configured for accessing the memory 102. As a result, a speed of operation of the SoC 100 is high. Additionally, when the memory 102 includes the set of non-memory mapped segments, the error injection controller 104 eliminates a dependency of the injection logic circuit 106 on the processing core 110 to access the memory 102 for error injection.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system-on-chip (SoC), comprising:
a memory;
an error injection controller that is coupled with the memory, and configured to generate error data, a trigger signal, and at least one of read and write access requests associated with the memory;
an injection logic circuit that is coupled with the error injection controller, and configured to:
receive the error data, the trigger signal, at least one of the read and write access requests, and at least one of first data and second data;
one of (i) access the memory based on the trigger signal having a first logic level and at least one of the read and write access requests to execute at least one of read and write operations associated with the first data and the second data and (ii) access the memory based on the trigger signal having a second logic level and control information from a processing core of the SoC to execute a set of memory operations of the processing core without error injection; and
inject, based on the error data, the trigger signal having the first logic level, and after accessing the memory, an error in at least one of the first data and the second data to generate at least one of erroneous first data and erroneous second data, respectively; and
an error detection circuit that is coupled with the injection logic circuit, and configured to receive at least one of the erroneous first data and the erroneous second data, and detect the error in at least one of the erroneous first data and the erroneous second data to generate an error signal.

2. The SoC of claim 1, wherein the injection logic circuit comprises:
an edge detection circuit that is coupled with the error injection controller, and configured to receive the trigger signal, detect an edge of the trigger signal, and generate a select signal based on the detected edge of the trigger signal; and
a selection circuit that is coupled with the edge detection circuit and the error injection controller, and configured to receive the select signal, control information, and at least one of the read and write access requests, wherein the selection circuit is further coupled with the memory, and further configured to select and transmit, based on the select signal, one of the control information and at least one of the read and write access requests to the memory.

3. The SoC of claim 2, further comprising the processing core being coupled with the selection circuit, and configured to generate and transmit the control information to the selection circuit to execute flail the set of memory operations, wherein the control information includes at least one of control data, a memory address of the memory, and the memory access request, and wherein the control data corresponds to at least one of data to be written to and data to be read from a memory location associated with the memory address based on the memory access request.

4. The SoC of claim 2, wherein the injection logic circuit further comprises:
a delay circuit that is coupled with the edge detection circuit, and configured to receive the select signal and delay the select signal by a predetermined value to generate a delay signal; and
an error injector that is coupled with the delay circuit, the error injection controller, and the memory, and configured to receive the delay signal and inject the error in at least one of the first data and the second data based on the error data and the delay signal to generate at least one of the erroneous first data and the erroneous second data, respectively.

5. The SoC of claim 4, wherein the selection circuit is further coupled with the memory, and further configured to receive and transmit the first data to the memory to execute the read operation when the selection circuit outputs the read access request, wherein the memory is configured to receive and store the first data at a read address of the memory associated with the read access request, and wherein the error injection controller is further configured to generate the first data.

6. The SoC of claim 5, wherein the error injector is further configured to receive the first data from the memory, and wherein the error injector generates the erroneous first data such that the erroneous first data has at least one of single-bit and multi-bit errors.

7. The SoC of claim 6, wherein the error injector is further coupled with the error detection circuit, and further configured to transmit the erroneous first data to the error detection circuit.

8. The SoC of claim 4, wherein when the selection circuit outputs the write access request, the selection circuit is further configured to receive and output input data to execute the write operation, and wherein the error injection controller is further configured to generate the input data.

9. The SoC of claim 8, further comprising a data generator that is coupled with the selection circuit, and configured to receive the input data based on the select signal, wherein the data generator is further coupled with the error injector, and further configured to generate and transmit the second data to the error injector.

10. The SoC of claim 9, wherein:
the error injector is further configured to receive the second data from the data generator,
the error injector generates the erroneous second data such that the erroneous second data has at least one of single-bit and multi-bit errors,
the error injector is further configured to transmit the erroneous second data to the memory,
the memory is further configured to receive and store the erroneous second data at a write address of the memory associated with the write access request, and
the error detection circuit receives the erroneous second data from the memory.

11. The SoC of claim 1, further comprising an error reporting circuit that is coupled with the error detection circuit, and configured to receive the error signal and identify at least one of single-bit and multi-bit errors as the detected error, wherein the error signal indicates at least one of the single-bit and multi-bit errors, and wherein the error reporting circuit is further configured to correct the single-bit error, and reset the SoC when the error reporting circuit identifies the multi-bit error.

12. The SoC of claim 1, wherein the error injection controller generates the at least one of read and write access requests without having to configure the processing core to access the memory.

13. An error injection method, comprising:
generating, by an error injection controller of a system-on-chip (SoC), error data, a trigger signal, and at least one of read and write access requests associated with a memory of the SoC;
receiving, by an injection logic circuit of the SoC, the error data, the trigger signal, at least one of the read and write access requests, and at least one of first data and second data;
one of (i) accessing, by the injection logic circuit, the memory based on the trigger signal having a first logic level and at least one of the read and write access requests to execute at least one of read and write operations associated with the first data and the second data and (ii) access the memory based on the trigger signal having a second logic level and control information from a processing core of the SoC to execute a set of memory operations of the processing core without error injection;
injecting, by the injection logic circuit based on the error data and the trigger signal having the first logic level, and after accessing the memory, an error in at least one of the first data and the second data to generate at least one of erroneous first data and erroneous second data, respectively;
receiving, by an error detection circuit of the SoC, at least one of the erroneous first data and the erroneous second data; and
detecting, by the error detection circuit, the error in at least one of the erroneous first data and the erroneous second data to generate an error signal.

14. The error injection method of claim 13, further comprising:
detecting, by the injection logic circuit, an edge of the trigger signal;
generating, by the injection logic circuit, a select signal based on the detected edge of the trigger signal;
receiving, by the injection logic circuit, control information;
selecting, by the injection logic circuit based on the select signal, one of the control information and at least one of the read and write access requests; and
transmitting, by the injection logic circuit, one of the control information and at least one of the read and write access requests to the memory.

15. The error injection method of claim 14, further comprising:
generating, by the processing core of the SoC, the control information; and
transmitting, by the processing core of the SoC, the control information to the injection logic circuit to execute flail the set of memory operations, wherein the control information includes at least one of control data, a memory address of the memory, and a memory access request, and wherein the control data corresponds to at least one of data to be written to and data to be read from a memory location associated with the memory address based on the memory access request.

16. The error injection method of claim 14, further comprising delaying, by the injection logic circuit, the select signal by a predetermined value to generate a delay signal, wherein the error is injected, by the injection logic circuit, in at least one of the first data and the second data further based on the delay signal.

17. The error injection method of claim 16, further comprising:
generating, by the error injection controller, the first data;
receiving, by the injection logic circuit, the first data when the read access request is outputted by the injection logic circuit;
transmitting, by the injection logic circuit, the first data to the memory to execute the read operation;
receiving, by the memory, the first data;
storing, by the memory, the first data at a read address of the memory associated with the read access request;
receiving, by the injection logic circuit, the first data from the memory, wherein the erroneous first data is generated, by the injection logic circuit, such that the erroneous first data has at least one of single-bit and multi-bit errors; and
transmitting, by the injection logic circuit, the erroneous first data to the error detection circuit.

18. The error injection method of claim 14, further comprising:
generating, by the error injection controller, input data;
receiving, by the injection logic circuit, the input data when the injection logic circuit outputs the write access request; and
outputting, by the injection logic circuit, the input data to execute the write operation.

19. The error injection method of claim 18, further comprising:
- receiving, by a data generator of the SoC, the input data based on the select signal;
- generating, by the data generator, the second data; and
- transmitting, by the data generator, the second data to the injection logic circuit.

20. The error injection method of claim 19, further comprising:
- receiving, by the injection logic circuit, the second data from the data generator, wherein the erroneous second data is generated, by the injection logic circuit, such that the erroneous second data has at least one of single-bit and multi-bit errors;
- transmitting, by the injection logic circuit, the erroneous second data to the memory;
- receiving, by the memory, the erroneous second data; and
- storing, by the memory, the erroneous second data at a write address of the memory associated with the write access request, wherein the error detection circuit receives the erroneous second data from the memory.

21. The error injection method of claim 13, further comprising:
- receiving, by an error reporting circuit of the SoC, the error signal;
- identifying based on the error signal, by the error reporting circuit, at least one of single-bit and multi-bit errors as the detected error;
- correcting, by the error reporting circuit, the single-bit error; and
- resetting, by the error reporting circuit, the SoC when the multi-bit error is identified by the error reporting circuit.

22. The error injection method of claim 13, wherein the error injection controller generates the at least one of read and write access requests without having to configure the processing core to access the memory.

\* \* \* \* \*